United States Patent [19]

Pace et al.

[11] Patent Number: 4,929,910
[45] Date of Patent: May 29, 1990

[54] LOW CURRENT AMPLIFIER WITH CONTROLLED HYSTERESIS

[75] Inventors: Gary L. Pace; David H. Overton, both of Boca Raton, Fla.

[73] Assignee: Motorola, Inc., Schaumburg, Ill.

[21] Appl. No.: 377,033

[22] Filed: Jul. 10, 1989

[51] Int. Cl.[5] .............................................. H03F 3/45
[52] U.S. Cl. ..................... 330/257; 330/288
[58] Field of Search ............... 323/315, 316; 330/252, 330/257, 261, 288, 296

[56] References Cited

U.S. PATENT DOCUMENTS 4,558,287 12/1985 Tanaka ........................... 330/288 X

FOREIGN PATENT DOCUMENTS 7608450 7/1976 Netherlands ........................ 330/257

OTHER PUBLICATIONS

Blauschild, Robert A.; An Open Loop Programmable Amplifier with Extended Frequency Range: IEEE Journal of Solid-State Circuits, vol. SC-16, No. 6, Dec. 1981; pp. 626-633.

Holt, James G.; A Two-Quadrant Analog Multiplier Integrated Circuit; IEEE Journal of Solid-State Circuits, vol. SC-8, No. 6, Dec. 1973; pp. 434-439.

Primary Examiner—Steven Mottola
Attorney, Agent, or Firm—William E. Koch; Vincent B. Ingrassia; Anthony J. Sarli, Jr.

[57] ABSTRACT

An improved amplifier with controlled hysteresis and an extremely low current drain capable of operating over a sufficiently large input voltage dynamic range is provided. Two circuits comprising a transistor and a diode are coupled between a differential amplifier and two cross-coupled current mirrors for preventing transistor saturation in the current mirrors.

14 Claims, 3 Drawing Sheets

LOW CURRENT AMPLIFIER WITH CONTROLLED HYSTERESIS

FIELD OF THE INVENTION

This invention relates in general to controlled hysteresis amplifier circuits, and in particular to controlled hysteresis amplifier circuits for use in applications requiring low current drain and large input voltage dynamic range.

BACKGROUND OF THE INVENTION

Many portable electronic products today use battery power for operation. In many applications, especially products with real time clocks, certain circuits must operate even when the product is in an OFF mode. These circuits would need to have a low current drain to preserve battery life.

Differential amplifiers with selectable hysteresis are known which allow the hysteresis trip voltages to be determined by a ratio of transistor emitter areas. A circuit of this type, shown in FIG. 1, provides a controlled hysteresis with low current drain, but the circuit is functional only over a narrow range of input voltages. Unless the input voltages are within the narrow range centering around one-half of a diode voltage drop, the circuit cannot function.

Thus, what is needed is an amplifier with hysteresis and an extremely low current drain capable of operating over a sufficiently large input voltage dynamic range.

SUMMARY OF THE INVENTION

Accordingly, it is an object of the present invention to provide an improved amplifier with controlled hysteresis.

It is another object of the present invention to provide an improved amplifier with controlled hysteresis and low current drain.

It is a further object of the present invention to provide an improved amplifier with controlled hysteresis and an extremely low current drain capable of operating over a sufficiently large input voltage dynamic range.

In carrying out the above and other objects of the invention, there is provided an amplifier circuit including a differential amplifier, two current mirrors and two circuits designed to prevent saturation of the current mirrors. The differential amplifier is adapted to receive two input voltages. A bias current source is coupled to it, providing input current. The differential amplifier has two outputs, each output connected to an input of each of the saturation preventing circuits. The saturation preventing circuits have two inputs and two outputs. The second input of both of the saturation preventing circuits is adapted to be coupled to a supply voltage. Two current mirrors, each with an input and an output, are cross-coupled one to the other. The two outputs of each of the saturation preventing circuits are coupled to the inputs and outputs of each of the current mirrors, respectively. Two output currents are taped from the outputs of the two current mirrors. A hysteresis region is defined in the relationship between the difference of the two output currents and the difference of the two input voltages.

The above and other objects, features, and advantages of the present invention will be better understood from the following detailed description taken in conjunction with the accompanying drawings.

DETAILED DESCRIPTION OF THE INVENTION

Turning now to the various drawing figures, in which like numerals reference like parts, a detailed description of the preferred embodiment will be provided.

Figure 1:
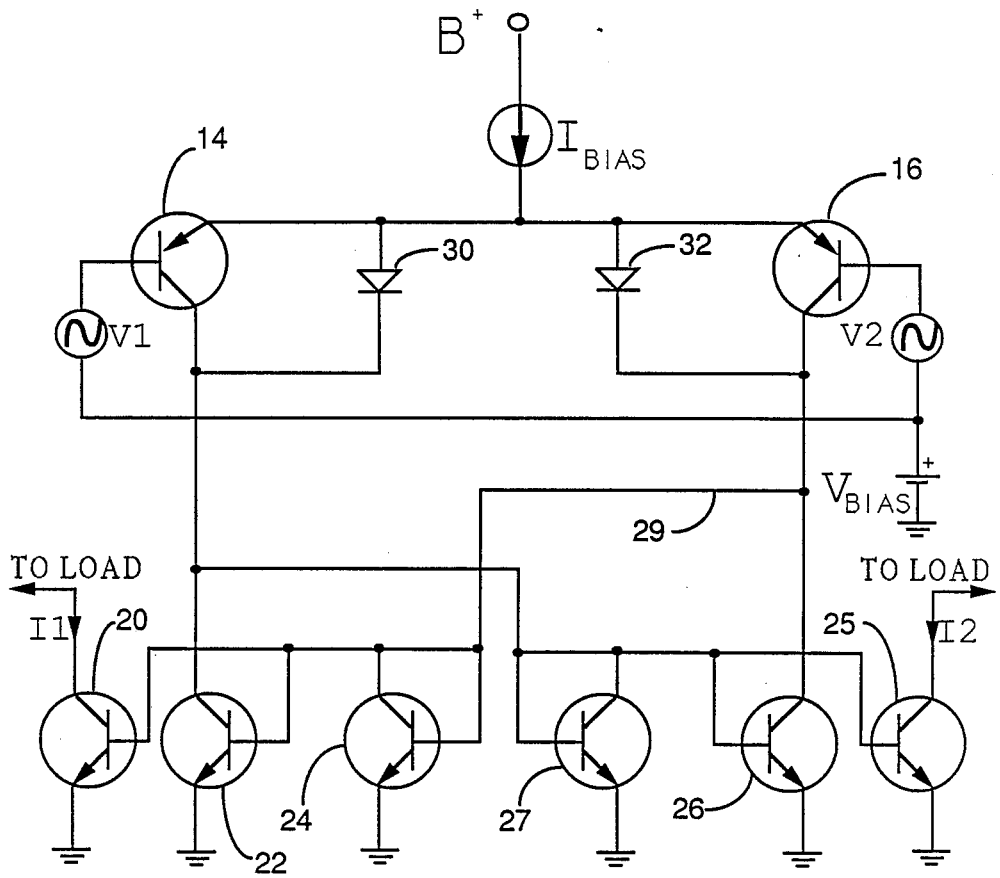
FIG. 1 is a schematic diagram of a prior art circuit for low current amplification with hysteresis.

Referring to FIG. 1, a prior art low current amplifier circuit has a battery voltage source B+ providing driving current $I_{BIAS}$ to transistors 14 and 16 and diodes 30 and 32. Transistors 14 and 16 form a standard bipolar transistor differential amplifier having input voltages, V1 and V2 provided thereto. Bias voltage $V_{BIAS}$ is likewise a component of the voltage applied to the bases of transistors 14 and 16. The two outputs of the differential amplifier from the collectors of transistors 14 and 16 are coupled to a differential current amplifier. The differential current amplifier is formed by two current mirrors comprising transistors 20,22 and 24 and transistors 25,26 and 27. The outputs, I1 and I2, of the differential current amplifier are taken from the collectors of transistors 20 and 25, respectively. The gain of the current mirrors are determined by the ratio of the emitter area of transistor 22 to the emitter area of transistor 24 for one current mirror and by the ratio of the emitter area of transistor 26 to the emitter area of transistor 27. Diodes 30 and 32 are connected to prevent collector emitter voltage saturation in transistors 22 and 26. Bias voltage $V_{BIAS}$ is selected to be equal to approximately one-half diode voltage drop.

If both current mirrors have a gain greater than one, the differential current amplifier will have two stable circuit conditions. Transistors 22 or 26 will attempt to go into saturation and cause the other transistor to shut off. Diode 30 or 32 will conduct and shunt sufficient current around transistors 14 and 16 to maintain the ratio of currents through transistors 22 and 24 or through transistors 26 and 27 to be equal to the corresponding ratio of emitter areas. An output current will then be generated at the collector of transistor 20 (I1) or the collector of transistor 25 (I2). The circuit will remain in this condition until the input voltages, V1 and V2 are adjusted to cause the output current ratio of the differential amplifier, comprised of transistors 14 and 16, to exceed the gain of the conducting current mirror transistor pair 22 and 24 or 26 and 27. At this time the output current will be switched to the opposite side of the circuit. For sufficiently large transistor Beta, the current mirror gain will be equal to the ratio of the corresponding mirroring transistor emitter areas. The transfer function of the differential amplifier, comprised of transistors 14 and 16, will then result in the hysteresis trip voltages being a logarithmic function of the ratio of transistor emitter areas.

The drawback of this circuit implementation is that this design requires at least one of the two input voltages, V1 and V2, to the circuit to be restricted to a narrow voltage range, i.e., 300 mV, centered at approximately one-half diode voltage drop above ground. Also, saturation protection diodes 30 and 32 are coupled to either side of transistors 14 and 16, and shunt bias current $I_{BIAS}$, around one or the other of transistors 14 or 16, which together comprise a differential amplifier. This results in a loss of control of output currents I1 and I2 when the input voltages are outside the narrow range specified above. The limited input voltage dynamic range of this prior art circuit severely restricts its use in higher voltage circuits.

Figure 2:
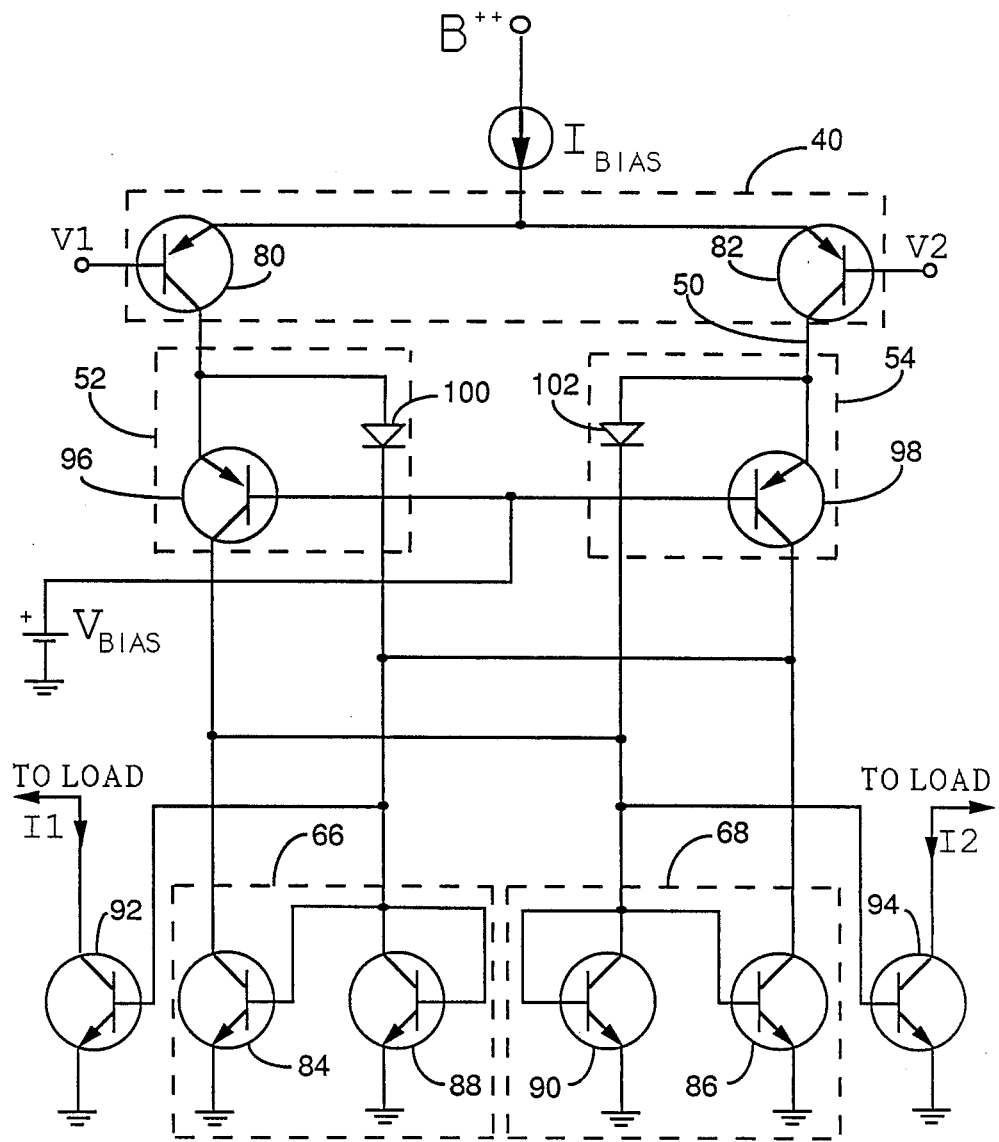
FIG. 2 is a schematic diagram of the preferred embodiment of the present invention.

Turning to FIG. 2, the preferred embodiment of the present invention is a differential transconductance amplifier with large input voltage dynamic range, controlled hysteresis, and low current drain and is suitable to be manufactured in monolithic integrated circuit form. Differential amplifier 40, comprised of transistors 80 and 82 and bias current source $I_{BIAS}$, received input voltages, V1 and V2. $I_{BIAS}$ is derived from voltage source B++. A bias voltage, $V_{BIAS}$, is provided to transistors 96 and 98 of saturation prevention circuits 52 and 54, respectively. In the preferred embodiment, bias voltage, $V_{BIAS}$, is selected to be equal to approximately one-half diode voltage drop. More particularly, the preferred value of $V_{BIAS}$ is 0.25 volts DC for the case where $I_{BIAS}$ is 0.5 $\mu$amps.

Transistors 96 and 98 and diodes 100 and 102 are coupled to current mirrors 66 and 68, respectively, to prevent collector-emitter voltage saturation in mirroring transistors 84 and 86. Current mirror 66, comprised of transistors 84 and 88, is cross-coupled to current mirror 68, comprised of transistors 86 and 90. Output transistor 92 coupled to current mirror 66 switches output current I1 OFF and ON. Similarly, output transistor 94 coupled to current mirror 68 controls the ON and OFF condition of output current I2.

Current mirrors 66 and 68 each have a corresponding gain, $K_o$. For sufficiently large transistor Beta, the current mirror gain will be equal to the ratio of the corresponding mirroring transistor emitter areas. Thus, the gain of current mirror 66 is measured as the ratio of the emitter area of transistor 84 to the emitter area of transistor 88. Likewise, the gain of current mirror 68 is measured as the ratio of the emitter area of transistor 86 to the emitter area of transistor 90. The cross-coupled current mirrors 66 and 68 will have two stable circuit conditions provided that both current mirrors have a gain greater than one. In the preferred embodiment, the gains of current mirrors 66 and 68 are two. The emitter areas of output transistors 92 and 94 are normally chosen to be equal to the emitter areas of current mirror transistors 88 and 90, respectively.

One or both of the output transistors 92 and 94 can be eliminated in some applications. If a single-ended output is desired, transistor 92 or transistor 94 can be removed from the circuit, depending upon the output signal polarity desired. Both transistors 92 and 94 can be eliminated from the circuit if an output voltage is taken from the collector of current mirror transistor 84 or the collector of current mirror transistor 86. Alternately, an output current can be developed by inserting a load between the emitters of current mirror transistors 84 and 88 and ground and/or between the emitters of current mirror transistors 86 and 90 and ground.

In one stable circuit condition, transistor 84 will attempt to go into saturation and cause transistor 86 to turn off. Diode 102 will conduct and shunt sufficient current around transistor 98 to maintain the ratios of currents through 84 and 88 to be equal to the corresponding ratio of emitter areas. All of the bias current, $I_{BIAS}$, will then flow through current mirror 66. When current mirror 66 is conducting, output current I1 will be equal to $I_{BIAS}/(K_o+1)$ and output current I2 will be zero. The circuit will remain in this state until the differential input voltage (V1−V2) is adjusted to cause the output current ratio of differential amplifier 40 to exceed the gain of conducting current mirror 66. At this point, defined as input voltage trip point VT1, the output current, $I_{BIAS}(K_o+1)$, will be switched to the opposite side of the circuit and the amplifier circuit of the present invention will switch to the second stable circuit condition.

In the second stable circuit condition, transistor 86 will attempt to go into saturation and cause transistor 84 to turn off. Diode 100 will conduct and shunt sufficient current around transistor 96 to maintain the ratios of currents through transistors 86 and 90 to be equal to the corresponding ratio of emitter areas. All of the bias current, $I_{BIAS}$, will then flow through transistor current mirror 68. When current mirror 68 is conducting, an output current I2 will be equal to $I_{BIAS}/(K_o+1)$ and output current I1 will be zero. The circuit will switch back to the first stable circuit condition when the differential input voltage (V1−V2) is adjusted to cause the output current ratio of differential amplifier 40 to exceed the gain of conducting current mirror pair 68, i.e., at a point defined as the input voltage trip point VT2.

When the circuit switches stable circuit conditions at one of the two voltage trip points, VT1 or VT2, transistors 84 and 86 will not be near saturation, diodes 100 and 102 will not be conducting, and the output currents of differential amplifier 40 will be applied directly to the cross-coupled current mirrors via transistors 96 and 98. Therefore, the addition of diodes 100 and 102 and transistors 96 and 98 to this circuit does not affect the voltage trip points.

If diodes 100 and 102 and transistors 96 and 98 were eliminated from the circuit in FIG. 2, transistors 84 and 86 would alternately saturate and part of the current into the current mirrors would be injected into the integrated circuit substrate. The saturation would result in a loss of control of the amplitude of the output current I1 and I2. This would make interfacing to the following circuit difficult. Saturation in transistors 84 and 86 would also degrade the high frequency response of the circuit.

Unlike the prior art circuit of FIG. 1, the input voltage dynamic range of the hysteresis amplifier circuit in FIG. 2 is limited only by the breakdown voltages of transistors 80,82 and bias current source $I_{BIAS}$. In particular, the input voltage dynamic range of the amplifier circuit of FIG. 2 is limited to input voltage values for V1 and V2 between approximately one-half diode voltage drop above ground to approximately one diode voltage drop below supply voltage B++. For example, with a supply voltage B++ of 10 volts, and a diode voltage drop of 0.50 volts, the input voltage dynamic range of the preferred embodiment of the present invention is from 0.25 volts to 9.5 volts. Thus, the amplifier circuit of FIG. 2 has an input voltage range of 9.25 volts while the prior art circuit has an input voltage range of 300 millivolts.

Because the amplifier circuit in FIG. 2 requires no resistors, the circuit can be easily implemented on an IC. Bias current $I_{BIAS}$ in the preferred embodiment is set at a level less than 1 $\mu$A.

Figure 3:
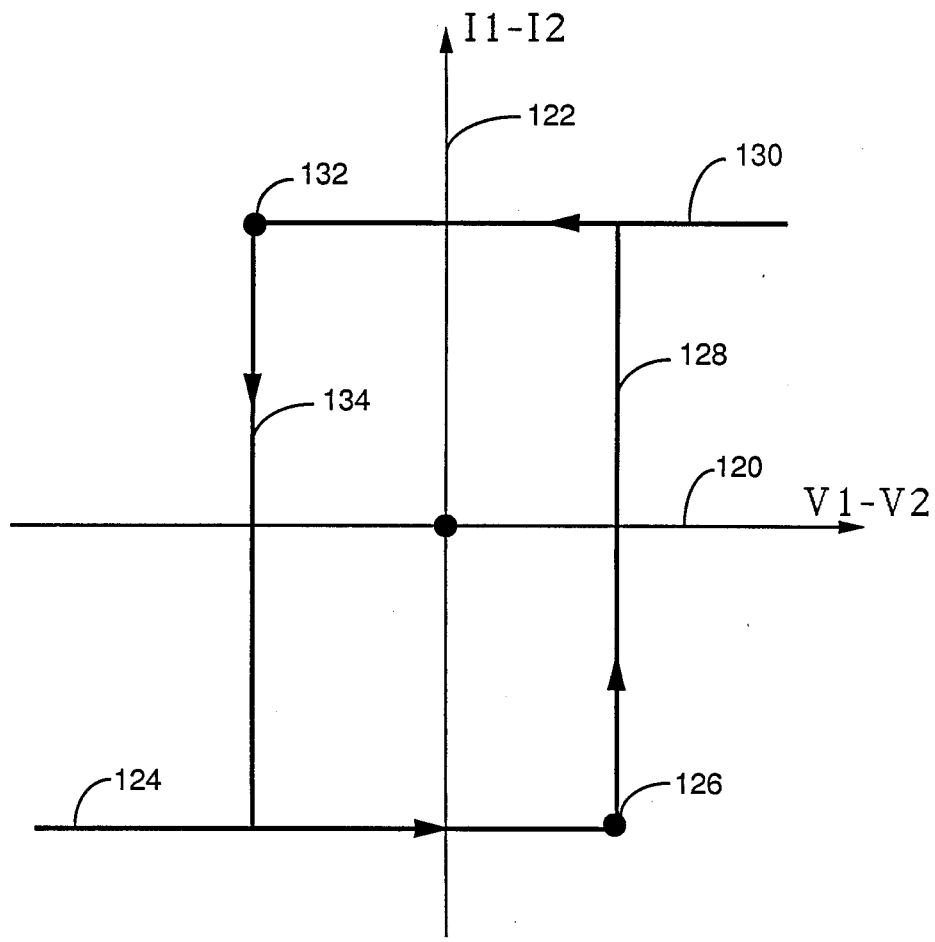
FIG. 3 is a graphic representation of the relationship between the difference in output currents and the difference in input voltages.

Turning to FIG. 3, the transfer function of the amplifier is graphically shown. Along axis 120, values for the difference in input voltages expresses as $$V1-V2$$

are plotted. Along axis 122, values for the difference in output currents expressed as $$I1-I2$$

are plotted. It will be seen that for all differences in input voltages, there are only two possible output current differences. When current mirror 66 (FIG. 2) is conducting, output current I1 will be equal to $I_{BIAS}/(K_o+1)$ and output current I2 will be zero. Thus, the difference I1−I2 will be equal to $$I_{BIAS}/(K_o+1)$$

and is shown as line 130 coming from the right hand side of FIG. 3. When the differential input voltage (V1−V2) is adjusted to cause the output current ratio of differential amplifier 40 (FIG. 2) to exceed the gain of conducting current mirror 66 (FIG. 2), the output current will be switched from I1 to I2. This occurs at input voltage trip point VT1, shown as point 132.

Line 124 represents the difference in output currents I1−I2 where the current difference value is $$-I_{BIAS}/(K_o+1).$$

flowing through transistor current mirror 68 (FIG. 2). As the differential input voltage (V1−V2) is adjusted to cause the output current ratio of differential amplifier 40 (FIG. 2) to exceed the gain of conducting current mirror 68 (FIG. 2), the transfer function is depicted by line 124 following the arrows to the right. At the point where the output current ratio of differential amplifier 40 (FIG. 2) exceeds gain of conducting current mirror 68 (FIG. 2), i.e., input voltage trip point VT2 depicted as point 126, the output current will be switched from I2 to I1. Thus, the transfer function shown graphically in FIG. 3 forms a hysteresis region in the area bounded by lines 124, 128, 130 and 134. The transfer function of differential amplifier 40 (FIG. 2) will result in the hysteresis trip voltages being a logarithmic function of the ratio of transistor emitter areas. The hysteresis trip voltage points, VT1 and VT2, are given by the equation:

$$VT2 = -VT1 = (KT/q) \ln K_o \beta \gg 1$$

where:
K = Boltzmann's Constant
T = Temperature in degrees Kelvin
q = electron charge
β = Transistor Beta $$K_o = \frac{\text{Transistor 84 Emitter Area}}{\text{Transistor 88 Emitter Area}} = \frac{\text{Transistor 86 Emitter Area}}{\text{Transistor 90 Emitter Area}} > 1$$

The amplifier hysteresis region is thus accurately controlled by proper selection of the emitter area ratio, $K_o$, of transistors 84 through 90. In the preferred embodiment, the ratios are 2:1. It is to be understood that the gains of current mirrors 66 and 68 do not have to be equal to obtain the advantages of the present invention.

By now it should be appreciated that there has been provided an improved amplifier with controlled hysteresis and an extremely low current drain capable of operating over a sufficiently large input voltage dynamic range.

We claim:

1. An amplifier comprising:
    a current source;
    a differential amplifier for receiving a first input voltage and a second input voltage, said amplifier coupled to said current source and having a first output and a second output;
    a first current mirror having an input and an output;
    a second current mirror having an input and an output, said input and output cross-coupled to the output and input, respectively, of said first current mirror;
    first means for preventing voltage saturation across said second current mirror, having a first and second input and a first and second output, said first input coupled to said first output of said differential amplifier, said second input for coupling to a first supply voltage, said first output coupled to said input of said first current mirror, and said second output coupled to said output of said first current mirror; and
    second means for preventing voltage saturation across said first current mirror, having a first and second input and a first and second output, said first input coupled to said second output of said differential amplifier, said second input for coupling to said first supply voltage, said first output coupled to said input of said second current mirror, and said second output coupled to said output of said second current mirror.

2. The amplifier according to claim 1 wherein said differential amplifier comprises:
    a first transistor having an emitter coupled to said current source, a base adapted to be coupled to said first input voltage, and a collector coupled to said first input of said first means; and
    a second transistor having an emitter coupled to said current source, a base adapted to be coupled to said second input voltage, and a collector coupled to said first input of said second means.

3. The amplifier according to claim 1 wherein said first current mirror comprises a first transistor, having an emitter with a first predetermined emitter area, a collector and a base, and a second transistor, having an emitter with a second predetermined emitter area, a collector and a base; and said second current mirror comprises a third transistor having an emitter with a third predetermined emitter area, a collector and a base, and a fourth transistor having an emitter with a fourth predetermined emitter area, a collector and a base; wherein the emitters of said first, second, third and fourth transistor are adapted to be coupled to a second supply voltage, the bases of said first and second transistor and the collector of said second transistor are coupled to said first output of said first means, the bases of said third and fourth transistor and the collector of said fourth transistor are coupled to said first output of said second means, the collector of said first transistor is coupled to the second output of said first means, and the collector of said third transistor is coupled to the second output of said second means.

4. The amplifier of claim 3 wherein a first ratio defined by the ratio of said first predetermined emitter area to said second predetermined emitter area is equal to a second ratio defined by the ratio of said third predetermined emitter area to said fourth predetermined emitter area.

5. The amplifier of claim 3 wherein said first ratio and said second ratio are greater than one.

6. The amplifier of claim 4 wherein said first ratio and said second ratio are equal to two.

7. The amplifier of claim 1 wherein said first means includes a transistor having an emitter, a collector and a base and a diode means having an anode and a cathode and a diode voltage drop, said emitter coupled to said anode and said first output of said differential amplifier, said collector coupled to said input of said second current mirror, said base adapted to be coupled to said first supply voltage, and said cathode coupled to said output of said second current mirror.

8. The amplifier of claim 1 wherein said second means includes a transistor having an emitter, a collector and a base and a diode having an anode and a cathode and a diode voltage drop, said emitter coupled to said anode and said second output of said differential amplifier, said collector coupled to said input of said first current mirror, said base adapted to be coupled to said first supply voltage, and said cathode coupled to said output of said first current mirror.

9. The amplifier of claim 7 wherein said second means includes a transistor having an emitter, a collector and a base and a diode having an anode and a cathode and a diode voltage drop, said emitter coupled to said anode and said second output of said differential amplifier, said collector coupled to said input of said first current mirror, said base adapted to be coupled to said first supply voltage, and said cathode coupled to said output of said first current mirror.

10. The amplifier of claim 9 wherein said diode voltage drop of said first means is equal to said diode voltage drop of said second means.

11. The amplifier of claim 10 wherein said first supply voltage is substantially equal to one-half of said diode voltage drop of said first means.

12. The amplifier of claim 7 wherein said first supply voltage is substantially equal to 0.25 volts DC.

13. The amplifier of claim 1 wherein said first supply voltage is substantially equal to 0.25 volts DC.

14. The amplifier of claim 3 further comprising a first output device including a transistor having a base, an emitter and a collector and a second output device, including a transistor having a base, an emitter and a collector, wherein the bases of the transistors of said first and second output devices are coupled to the inputs of said first and second current mirrors, respectively, and the emitters of the transistors of said first and second output devices are adapted to be coupled to said second supply voltage; and wherein the collectors of the transistors of said first and second output devices are adapted to provide a first and second output, respectively, from said amplifier.

* * * * *